United States Patent

Shuff

[11] Patent Number: 5,812,374
[45] Date of Patent: Sep. 22, 1998

[54] ELECTRICAL CIRCUIT COOLING DEVICE

[76] Inventor: Gregg Douglas Shuff, 1326 Paseo Hermosa, Oceanside, Calif. 92056

[21] Appl. No.: 859,951

[22] Filed: May 21, 1997

Related U.S. Application Data

[60] Provisional application No. 60/029,368, Oct. 28, 1996, and 60/035,741, Jan. 3, 1997.

[51] Int. Cl.$^6$ ..................................... H05K 7/20
[52] U.S. Cl. ..................... 361/704; 361/707; 361/709; 361/720; 361/719; 257/717; 257/718; 257/719; 165/80.2; 165/80.3; 165/185
[58] Field of Search ................... 361/704, 699, 361/707, 719, 715, 712, 713; 257/706, 709, 717, 718, 719; 165/80.1, 80.2, 80.3, 185

[56] References Cited

U.S. PATENT DOCUMENTS

| | | | |
|---|---|---|---|
| 3,833,836 | 9/1974 | Moksu et al. | 317/100 |
| 4,109,707 | 8/1978 | Wilson et al. | 165/46 |
| 4,330,812 | 5/1982 | Token | 361/386 |
| 4,654,754 | 3/1987 | Daszkowski | 361/388 |
| 4,938,279 | 7/1990 | Betker | 165/46 |
| 4,979,074 | 12/1990 | Morley et al. | 361/386 |
| 4,997,032 | 3/1991 | Danielson et al. | 165/46 |
| 5,060,114 | 10/1991 | Feinberg et al. | 361/387 |
| 5,208,733 | 5/1993 | Besanger | 361/704 |
| 5,245,508 | 9/1993 | Mizzi | 361/694 |
| 5,251,099 | 10/1993 | Goss et al. | 361/721 |
| 5,280,411 | 1/1994 | Dirks et al. | 361/707 |
| 5,309,320 | 5/1994 | Smith | 361/704 |
| 5,315,480 | 5/1994 | Samarov et al. | 361/705 |
| 5,403,973 | 4/1995 | Santilli et al. | 174/15.1 |

*Primary Examiner*—Leo P. Picard
*Assistant Examiner*—Boris L. Chervinsky
*Attorney, Agent, or Firm*—Gene Scott-Patent Law & Venture Group

[57] ABSTRACT

A printed circuit card thermal conducting device provides a flexible, thermally conducting sheet with a cushioning layer on one side and a thermally conductive and resilient layer on the other side. On top of the thermally conductive and resilient layer is placed a number of thermal contact pieces of rigid material. Each of the contact pieces is defined to have a contour for making intimate contact with one electrical component mounted on the printed circuit card. The device is wedged between two of the printed circuit cards with the cushioning layer laying in contact with a backside surface of one of the cards, while the contact pieces of the same device lay in intimate contact with the components of another of the circuit cards. The cushioning material and the conductive and resilient material maintain good thermal contact between the contact pieces and the electrical components. The flexible sheet provides laterally positioned mounting portions for attachment of the flexible sheet to mechanical supports which also act as thermal heat sinks. In an alternate embodiment, the contact pieces may be part of a monolithic structure.

15 Claims, 2 Drawing Sheets

ELECTRICAL CIRCUIT COOLING DEVICE

This application is a continuation of U.S. Provisional applications Ser. No. 60/029,368 filed on Oct. 28, 1996, and Ser. No. 60/035,741 filed on Jan. 3, 1997.

BACKGROUND OF THE INVENTION

1. Field of the Invention

This invention relates generally to heat conducting and sinking devices for printed circuit boards and similar electrical assemblies, and more particularly to a thermal conductor for cushioning and conducting heat from the components of one or more printed circuit assemblies.

2. Description of Related Art

The following art defines the present state of this field:

Moksu et al., U.S. Pat. No. 3,833,836 describes a printed circuit board package for severe environmental conditions of temperature, humidity and altitude as well as for relatively high vibration applications. First and second printed circuit boards are arranged in the recesses of first and second metallic plates and a resilient means located between the two printed circuit boards presses each board against its corresponding recess surface. In one embodiment, the resilient means takes the form of a sheetlike assembly consisting of a plurality of parallel arranged strips of rubber tubing which are held together by means of a sever environmental tape, such as high temperature fluorocarbon tape.

Wilson et al., U.S. Pat. No. 4,109,707 describes a fluid cooling system for electronic systems particularly adapted to cool large scale integrated circuit chips mounted on substrates. The system has one or more heat exchangers through which a liquid coolant is circulated. Each heat exchanger has a flexible wall and is mounted so that its flexible wall is in close proximity to a surface of the substrate to be cooled. A low thermal impedance contact is made through the flexible wall of the head exchanger between the substrate to be cooled and the coolant flowing through the heat exchanger because of the pressure of the coolant in the heat exchanger. The heat exchangers are connected into the cooling system through flexible conduits so that a heat exchanger can readily be moved out of contact with a substrate without disrupting the flow of coolant through the cooing system.

Token, U.S. Pat. No. 4,330,812 describes cooling of electronic components on a circuit board that is accomplished by a thermally conductive elements such as a heat pipe that is in spaced parallel relation to the board and in contact with the upper surfaces of the components. The ends of the conductive element are forced into contact with a heat receiving and dissipating frame by a clamp device acting through the board and a lightweight spacer between the board and the conductive element.

Daszkowski, U.S. Pat. No. 4,654,754 describes a thermal link that provides a thermal path between a heat source and a heat sink, which compensated for irregularities on the surface of the heat source and/or heat sink and/or non-uniformity in the spacing therebetween. One embodiment utilizes a spring metal device having a free arm, which allows the link to align itself under low pressure so that it is in intimate contact with both the heat source and heat sink. Another embodiment utilizes an elastomeric material filled with thermally conducting particles to form a mat that has a plurality of raised sections having air spaces between each of the sections. The raised areas deform under low pressure by expanding laterally into the air spaces to conform to the space between the heat source and the heat sink.

Betker, U.S. Pat. No. 4,938,279 describes an expandable and contractible sealed environment that is provided by a rigid frame member and a pair of deformable heat transfer elements fixed to the frame member. The frame member is located between two heat-producing electronic assemblies. A coolant agent is pumped into the sealed environment to flex the membranes and cause them to conformally contact the pair of electronic assemblies. Excess heat in the assemblies is then allowed to pass across the membranes and into the coolant agent for dissipation purposes. In order to remove the electronic assemblies, the pressure of the coolant agent is reduced, which permits the heat transfer element to return to its non-deformed state removed from the assembly. Thus, the electronic assemblies can be removed without the need to open fluid couplings.

Morley et al., U.S. Pat. No. 4,979,074 describes a heat sink for a printed circuit board that is comprised of a thermally-conductive plate having on one surface a thermally-conductive, electrically-insulative elastometer layer which conformally engages at least a portion of the back surface of the printed circuit board. The ends of pins of electronic components mounted on the board and desired to be cooled embed into the elastomer layer to provide a conductive path for transfer of heat from the electronic components to the elastomer layer and then to the thermally-conductive plate.

Danielson et al., U.S. Pat. No. 4,997,032 describes a thermal transfer means comprising a flexible bag or pouch filled with a chemically inert, electrically non-conductive, nonflammable, essentially gas-free, thermally stable, thermally conductive, body of liquid comprising fluorochemical liquid. Said bag is fabricated from a flexible, durable plastic film that has low permeability to air and the fluorochemical liquid. The configuration of the bad is conformable to adapt to the geometry of the space, formed between the surface of a heat generating component o components and the surface of a heat sink, into which the bag is inserted, thereby contacting said surfaces and providing a thermal conduction path for heat generated by the heat generating component during operation from said component to the heat sink. The liquid has a boiling point such that it down not boil at the highest operation temperature of the device. Also provided is a method for making and filling the bag that after sealing the bag is substantially gas free.

Feinberg et al., U.S. Pat. No. 5,060,114 describes a conformable, gel-like pad, preferably of silicone, with a thermally conductive additive that conducts heat away from a packaged electronic power device with which it is in contact. Formed by adding particles of a thermally conductive material such as aluminum powder, nickel, aluminum oxide, iron oxide, beryllium oxide, silver, etc., to a mixture of silicone resins and curing agents poured into a mold, the molded pad can be formed to accommodate virtually any geometry and size of electronic component to provide custom-fit at little cost.

Mizzi, U.S. Pat. No. 5,245,508 describes an increased surface contact area for circuit board heat removal, without exposing the circuit board components to the coolant fluid. This is accomplished by compressing a heat conductive flexible membrane between adjacent circuit boards. The flexible membrane contains coolant fluid, which is pumped into and out of the flexible membrane. The membrane isolates the circuit board components from the coolant fluid and is flexible enough so that it conforms to the surface of individual circuit boards.

Goss et al., U.S. Pat. No. 5,251,099 describes a high-density electronic package that houses a plurality of circuit cards, heat sinks, and circuit interconnections in a single housing. The electronics package uses conical shaped interfaces for locating and locking components, which greatly enhances the serviceability, thermal management and strength of the electronics package. Assembly is accomplished by using a selected conical angle on a first heat sink that mates with a matching conical surface on the housing.

Dirks et al., U.S. Pat. No. 5,280,411 describes a packaging for conventional printed circuit boards for protecting them from both thermal and mechanical stress. Heat conducting rails are attached to the edges of the card, and heat conducting leads used to connect heat generating components on the card to the rails. A support plate provides a rigid outer surface for the bottom of the card, with a shock-absorbing layer sandwiched between the support plate and the bottom surface of the card. A heat conductive coating over the top surface of the card and its components acts as an additional heat sink.

Samarov et al., U.S. Pat. No. 5,315,480 describes a system for cooling an electronic module in a computer system. In one embodiment of the invention, predetermined areas of the module, such as those exposed parts that carry electrical currents are covered with a conformable, electrically insulating layer. Thereafter, a second conformable, thermally conductive layer is formed on the first layer. In addition, surface-expanding elements may be arranged on the first layer near devices particularly sensitive to heat before the application of the second layer.

Santilli et al., U.S. Pat. No. 5,403,973 describes a protective heat-sinking device for an electronic circuit card having upper and lower layers of an air-impermeable polymer material forming an air-impermeable bag. A metallic foil having high thermal conductivity is inserted between the upper layer of air-impermeable polymer material and the top surface of the electronic circuit card. The air-impermeable bag has an open side into which the circuit card is inserted. The bag is evacuated to produce a conformal vacuum seal in which the upper and lower layers of air-impermeable polymer material and the metallic foil are drawn down onto the surface of the circuit card and form a conformal protective cover about its contours. A layer of electrically insulating material may be added between the metallic foil and an upper face of the circuit card to electronically insulate the metallic foil from the circuit components mounted on the upper face of the circuit card contained within the protective heat sinking device. A method for conformally sealing a circuit card in the protective heat-sinking device is also provided.

The prior art teaches the use of air cooling for temperature control in electrical circuits convective removal of thermal energy. It also teaches the use of resilient solid or liquid filled materials placed into contact with electrical components for heat energy removal by conduction. However, the prior art does not teach that a sculpted monolithic or series of separate units may be positioned into contact with electrical components for highly effective heat removal by conduction. The present invention provides this teaching for efficient temperature control in both low and high packing density circuit assemblies and provides further related advantages as described in the following summary.

SUMMARY OF THE INVENTION

The present invention teaches certain benefits in construction and use which give rise to the objectives described below.

The subject of this patent application is an improved cooling method for an electronic circuit card chassis system, utilizing heat conductive cooling modules. The chassis system includes one or more electronic circuit assemblies each having one or more electrical components mounted primarily on one side of a rigid insulating circuit card. These cards are mounted with structural integrity onto the chassis. The cooling module is an assembly made up of three parts; a heat conductive plate, or individual spacers, a heat conductive metal foil or flexible sheet, and an insulating and cushioning pad. In the following discussion, a single cooling module is discussed, however, it should be realized that typically, a plurality of such cooling modules is used, where the modules are placed between adjacent circuit assemblies and it is the physical and thermodynamic relationship between the circuit assemblies and the cooling modules that enables the invention to achieve its objectives.

The heat conductive plate, or spacers, is composed of a custom machined or molded metal or ceramic material which is contoured on one side to fit flush with the heat producing electrical components on a single electronic circuit assembly. The reverse side of the plate, or spacers, is mounted to the heat conductive foil or flexible sheet. In the case of individual spacers, each spacer has about the same surface area as the specific electrical component to which it is mated and is attached to the component using a heat conductive glue or equivalent method.

The heat conductive foil or flexible sheet consists of a flexible metal foil or sheet material, and may be made of copper or aluminum. The heat conductive sheet extends to side of the circuit assembly providing tabs for mounting the module assembly and for heat sinking the conductive sheet. The tabs are of sufficient length to extend to and be firmly affixed to heat sink plates. Notches may be provided in the tab to avoid obstacles within card mounting guides or in chassis system. The heat conductive foil is firmly affixed to the heat sink plates. Flexibility in the module assembly is important for improving the ability to install the module assembly, to improve shock and vibration isolation from the chassis as well as shock and vibration dampening in the electronic circuit assemblies themselves.

The insulator or cushioning pad is composed of an electrical insulating material such as a flexible foam and is approximately the same size as the electronic circuit cards. The cushioning pad is affixed to the reverse side of the heat conductive foil in order to provide an isolation barrier for the adjacent electronic circuit card. It also provides cushioning or shock and vibration dampening between the circuit cards.

The chassis system, supports the circuit cards via a card cage with card guides, and retains the cooling modules and heat sinks. The circuit cards normally have components on one side of the card and solder connections on the other side, however; low profile components may also be located on the other side in the present embodiment. The cooling module is positioned within the chassis so that the cooling plate or spacers will be in direct contact with components on the electronic circuit card, so the heat conductive plate or spacers conforms to the components, eliminating air gaps, providing a thermal path from the components through the heat conductive plate or spacers and the heat conductive foil or flexible sheet to the heat sinks. Heat sinks are provided as a means to expel excess beat generated within the chassis system. Thus, heat generated by individual components can flow to the heat sink where it will be expelled from the chassis system.

The insulation or cushioning pad provides an electrical insulation barrier from the solder side of the adjacent electronic circuit card. The pad is thick enough to prevent the ends of soldered pins from protruding through the pad and making contact with the heat conductive sheet. The pad material provides sufficient electrical insulation to prevent electrical shorts. The pad provides a cushioning or dampening effect, increasing the chassis system's ability to withstand higher shock and vibration loads, without damaging circuit boards or components.

The invention is used in a generally high mechanical shock and vibration environment, such as aboard aircraft, shipboard or vehicle installations. In addition to heat dissipation, the overall system must survive and operate within this environment. To provide adequate shock and vibration isolation, the card cage may be shock isolated from the chassis, providing a certain level of isolation for the electronic circuit cards mounted within the card cage. The flexibility of the foil or flexible sheet will provide a substantial shock and vibration isolation barrier between the chassis and electronic circuit cards within the card cage. Furthermore, because the modules are placed between electronic cards an increase in their tolerance to shock and vibration is achieved by substantially changing their mass, as well as changing their support points and by providing a cushioning or dampening effect. Each of the electronic circuit cards is firmly held in place by its components or ICs, and is cushioned from the adjacent electronic circuit cards via the insulation and cushioning pad.

Therefore, a primary objective of the present invention is to provide a heat conducting module for intimate thermal engagement with the components on a printed circuit board assembly, the module having advantages not taught by the prior art.

Another objective is provide a plurality of such modules in a sandwich arrangement with a series of such board assemblies so as to improve shock and vibration resistance to the board assemblies.

A further objective is to conduct the heat away from the board assemblies in such an effective manner as to maintain a satisfactory operating temperature in the board assemblies.

Other features and advantages of the present invention will become apparent from the following more detailed description, taken in conjunction with the accompanying drawings, which illustrate, by way of example, the principles of the invention.

BRIEF DESCRIPTION OF THE DRAWING

The accompanying drawings illustrate the present invention. In such drawings.

DETAILED DESCRIPTION OF THE INVENTION

Figure 3:
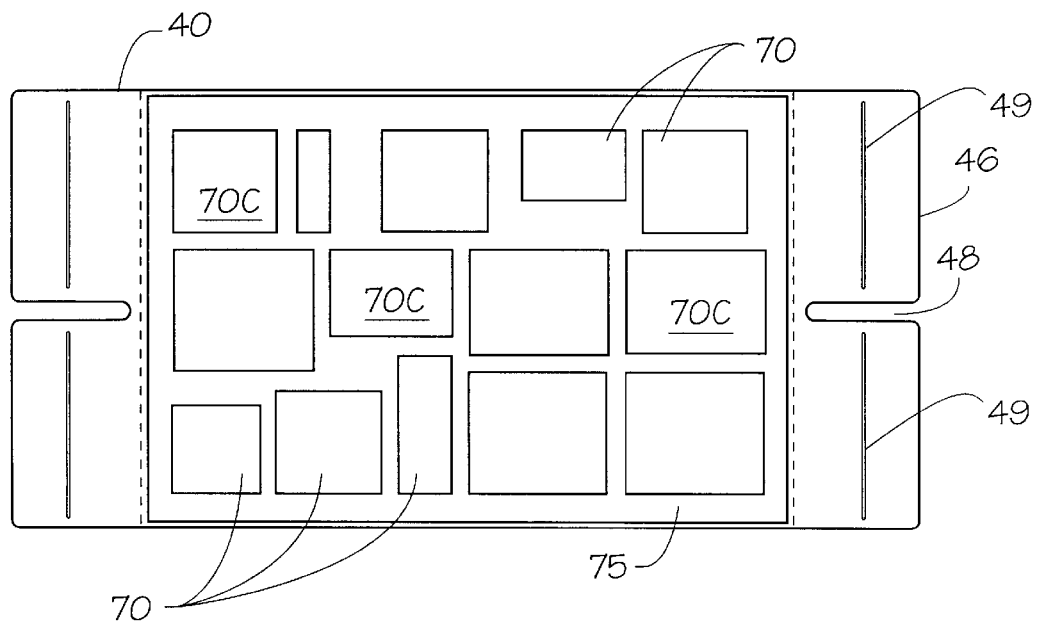
FIG. 3 is a front elevational view of another preferred embodiment of the present invention particularly showing a monolithic thermal spacer.
Figure 4:
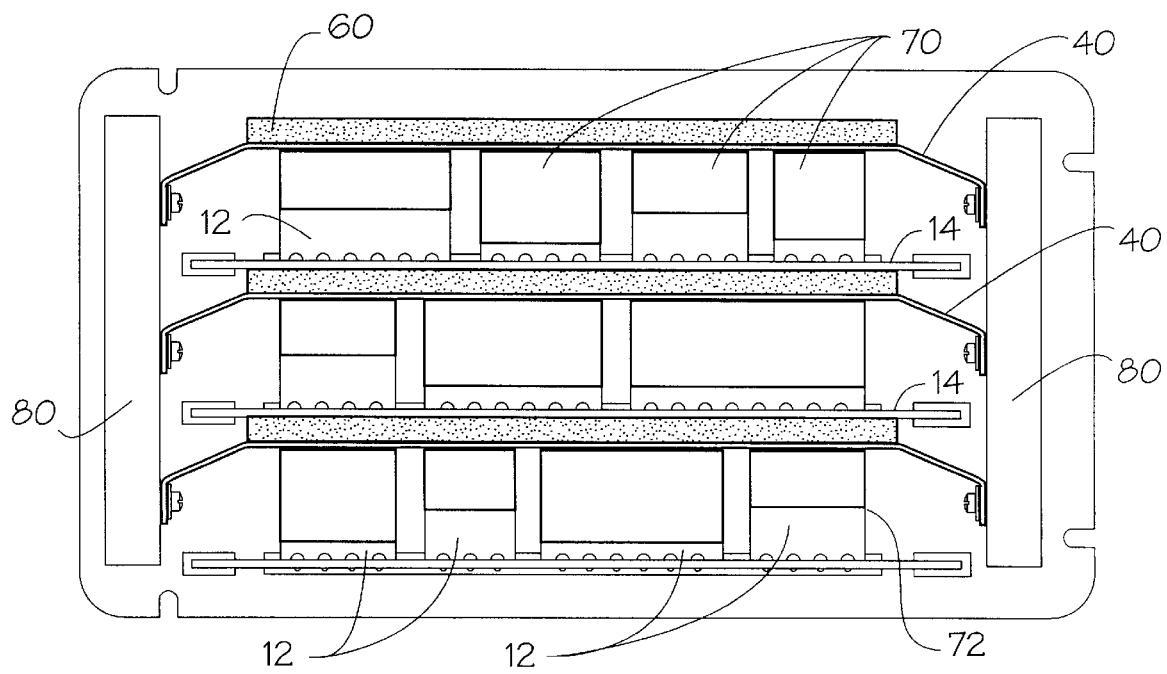
FIG. 4 is a plan view similar to that of FIG. 2 showing an alternate construction of the invention particularly with the thermal spacers joined directly to the conductive sheet.

The above described drawing figures illustrate the invention, a device for cooling an electrical circuit. In the preferred embodiment, a number of printed circuit board assemblies 10 are mounted on a chassis 30. Each of the circuit board assemblies 10 has a plurality of electrical components 12 mounted on one side of a planar rigid card or support means 14. The inventive device of the present invention is comprised of a flexible, thermally conductive sheet 40 that provides a front planar side 42 and a backside planar side 44. A frontside layer 50 of thermally conducting, electrically insulating and physically resilient material is preferably integrally engaged on the front side 42 of the conductive sheet 40 by a thermally conductive bonding agent, and extends outwardly from it. This frontside layer 50 may be a continuous layer of a foamed material or may alternately be a flexible liquid heat sink containing Flourinert™ or other heat conductive liquid. A backside layer 60 of thermally insulating, electrically insulating and physically resilient material is integrally engaged on the back side 44 of the conductive sheet 40 and extends outwardly in opposition to the frontside layer 50. These two layers 50, 60 sandwich the conductive sheet 40 between them. In an alternate embodiment shown in FIG. 4, the frontside layer 50 may not be used. A plurality of spatially separated thermal spacers 70 are integrally engaged on the front side 42 of the conductive sheet 40 directly, as shown in FIG. 4, or on the frontside layer 50 and extend outwardly into contact with the electrical components 12 of the circuit assembly 10. Each one of the thermal spacers 70 provides a contour 70C that corresponds with one of the electrical components 12 to establish intimate physical and thermal contact between the spacer 70 and the component 12. The spacers 70 may be part of a single monolithic block 75 as shown in FIG. 3. The thermal spacers 70 may be in simple point to point physical contact with the components 12, but for improved thermal transfer characteristics a heat transfer bonding agent 72 such as a metal filled epoxy may be used for joining these surfaces. For ease of removal, a thermal grease may be used instead of a bonding agent.

The conductive sheet 40 preferably includes a mounting portion 46. The mounting portion extends laterally and contiguously relative to a side edge 52 of the frontside layer 50 and a corresponding side edge 62 of the backside layer 60. The mounting portion 46 of the conductive sheet 40 preferably includes a slot means 48 useful for mounting the conductive sheet 40 or for assuring that the conductive sheet is able to avoid various constructional features of the equipment associated with the electrical circuits. The conductive sheet further may provide a means for sheet bend guidance 49 such as the score lines shown in FIG. 3 which enable one to bend the conductive sheet as necessary to establish its mounting as shown in FIGS. 2 and 4.

Figure 1:
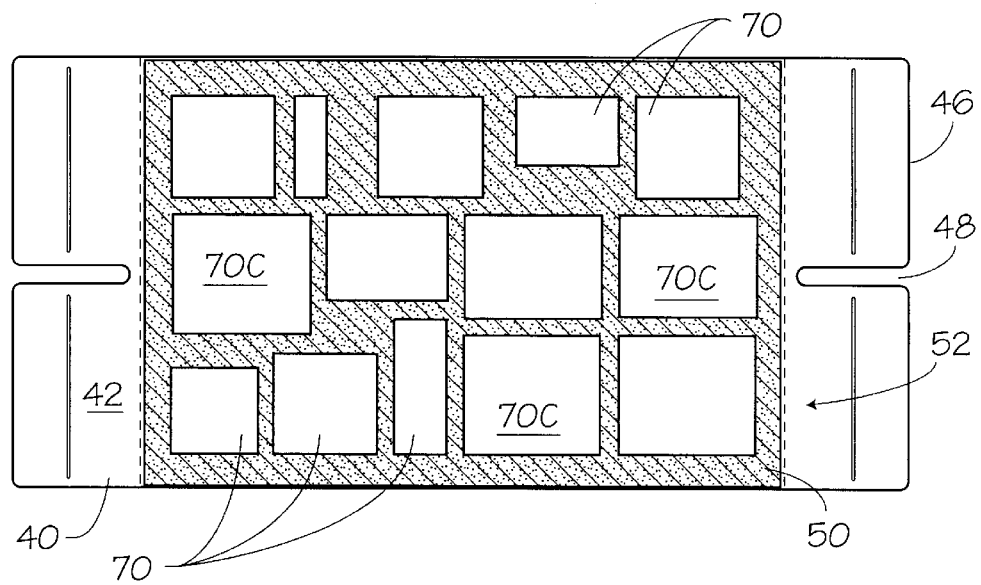
FIG. 1 is a front elevational view of a preferred embodiment of the present invention module particularly showing spatially separated thermal spacers mounted on a frontside layer on a conductive sheet.
Figure 2:
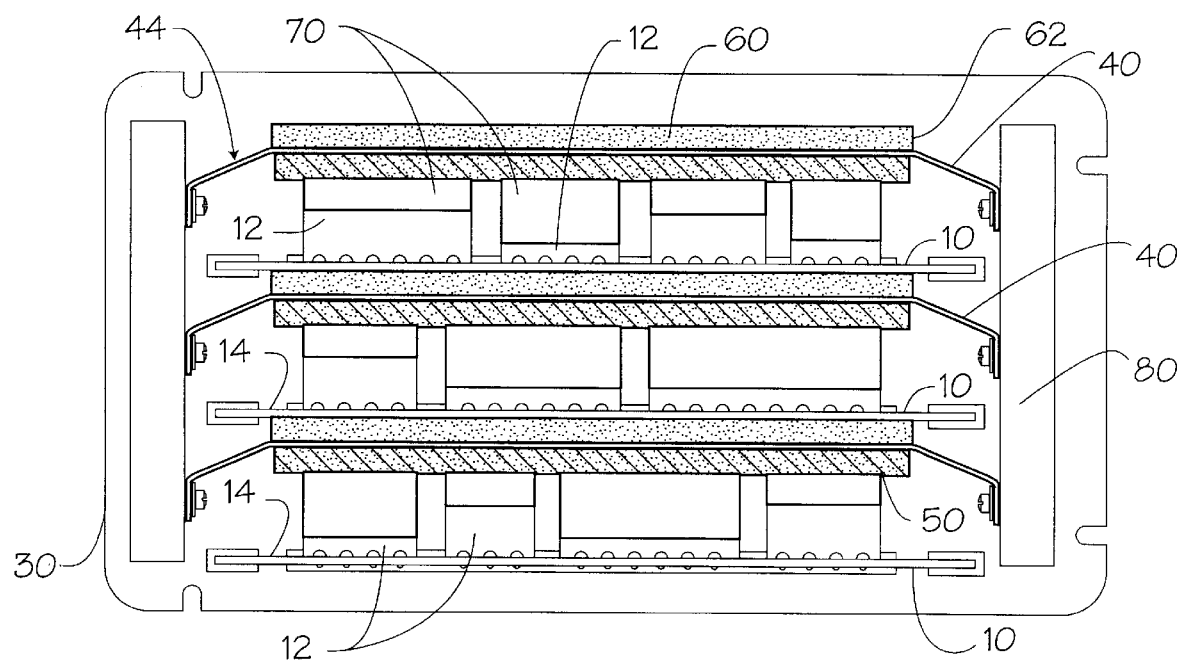
FIG. 2 is a top plan view thereof showing three printed circuit board assemblies as mounted on an electrical chassis in slide-entry channels, and three corresponding modules of the present invention interleaved therewith, the conductive sheets being laterally fastened to heat sinking elements secured to the chassis and thermal spacers being mounted to a frontside layer on the conductive sheets.

This invention is preferably used with a plurality of rigidly positioned electrical circuits 10 as shown in FIGS. 2 and 4, each circuit having a rigid, planar support means 14 and include electrical component means 12, such as resistors, capacitors, inductors and integrated circuits, that are mounted thereon and extend outwardly from the support means 14. The plurality of circuits are preferably arranged in parallel spaced-apart alignment. The component means preferably extends away from the several circuits 10 in a common direction. The conductive sheets 40 are sandwiched between the electrical circuits 10 such that the thermal energy produced within the circuits 10 is conducted to the conductive sheets 40 and shock and vibration is absorbed by the sheets due to the physical relationship between the circuits and the conductive sheets.

As shown in FIGS. 2 and 4, the conductive sheets 40 are fastened to heat sink blocks 80 for transfer of thermal energy.

While the invention has been described with reference to at least one preferred embodiment, it is to be clearly understood by those skilled in the art that the invention is not limited thereto. Rather, the scope of the invention is to be interpreted only in conjunction with the appended claims.

What is claimed is:

1. A device for cooling an electrical circuit, the circuit having a plurality of electrical components mounted on one side of a planar rigid card, the device comprising:
   a flexible, thermally conductive sheet providing a front planar side, and opposed thereto, a back planar side;
   a backside layer of thermally insulating, electrically insulating and physically resilient material integrally engaged on the back side of the conductive sheet and extending outwardly therefrom;
   a plurality of spatially separated, rigid, thermally conductive, spacers integrally engaged on the front side of the conductive sheet and extending outwardly therefrom into contact with the electrical components of the circuit, each one of the thermal spacers providing a contour corresponding with one of the electrical components to establish intimate physical and thermal contact therewith.

2. The device of claim 1 further including a frontside layer of thermally conducting, electrically insulating and physically resilient material integrally engaged on the front side of the conductive sheet and extending outwardly therefrom, the frontside layer being sandwiched between and integrally interconnected with the front side of the conductive sheet and the plurality of spacers.

3. The device of claim 2 wherein the conductive sheet provides a mounting portion, the mounting portion extending laterally and contiguously relative to a side edges of the frontside and backside layers.

4. The device of claim 3 wherein the mounting portion of the conductive sheet includes a slot means.

5. The device of claim 3 wherein the mounting portion of the conductive sheet includes a means for sheet bend urging.

6. A combination comprising:
   an electrical circuit means comprising a first plurality of rigidly positioned electrical circuits, each said circuit comprising a rigid, planar support means with electrical component means mounted fixedly thereon, and extending outwardly therefrom;
   the plurality of circuits arranged in parallel spaced-apart alignment, the component means extending away from all of the support means in a common direction;
   a heat conducting and cushioning means comprising a second plurality of flexible, thermally conductive sheets, each of the sheets providing a front planar side, and opposed thereto, a back planar side, each of the sheets further providing:
   a) a backside layer of thermally insulating, electrically insulating and physically resilient material integrally engaged on the back side of the conductive sheet and extending outwardly therefrom;
   b) a plurality of spatially separated thermal spacers integrally engaged on the front side and extending outwardly therefrom into contact with the electrical components of one of the electrical circuits, each one of the thermal spacers providing a physical contour corresponding with one of the electrical components to establish intimate physical and thermal contact therewith for conducting thermal energy from the one of the electrical components to the conductive sheet.

7. The device of claim 6 further including on each of the sheets, a frontside layer of thermally conducting, electrically insulating and physically resilient material integrally engaged on the front side of the conductive sheet and extending outwardly therefrom, the frontside layer being sandwiched between and integrally interconnected with the front side of the conductive sheet and the plurality of spacers.

8. The device of claim 7 wherein each of the conductive sheets provides a mounting portion, the mounting portion extending laterally and contiguously relative to a side edge of the frontside layer and a corresponding side edge of the backside layer.

9. The device of claim 8 wherein the mounting portion of the conductive sheet includes a slot means.

10. The device of claim 8 wherein the mounting portion of the conductive sheet includes a means for sheet bend urging.

11. A combination comprising:
    an electrical circuit means comprising a first plurality of rigidly positioned electrical circuits, each said circuit comprising a rigid, planar support means with electrical component means mounted fixedly thereon, and extending outwardly therefrom;
    the plurality of circuits arranged in parallel spaced-apart alignment, the component means extending away from all of the support means in a common direction;
    a heat conducting and cushioning means comprising a second plurality of flexible, thermally conductive sheets, each of the sheets providing a front planar side, and opposed thereto, a back planar side, each of the sheets further providing:
    c) a backside layer of thermally insulating, electrically insulating and physically resilient material integrally engaged on the back side of the conductive sheet and extending outwardly therefrom;
    d) a monolithic thermal spacer integrally engaged on the front side and extending outwardly therefrom into contact with the electrical components of one of the circuit means, the thermal spacer providing a physical contour corresponding with at least one of the electrical components to establish intimate physical and thermal contact therewith for conducting thermal energy from the at least one of the electrical components to the conductive sheet.

12. The device of claim 11 further including on each of the sheets, a frontside layer of thermally conducting, electrically insulating and physically resilient material integrally engaged on the front side of the conductive sheet and extending outwardly therefrom, the frontside layer being sandwiched between and integrally interconnected with the front side of the conductive sheet and the monolithic spacer.

13. The device of claim 12 wherein each of the conductive sheets provides a mounting portion, the mounting portion extending laterally and contiguously relative to a side edge of the frontside layer and a corresponding side edge of the backside layer.

14. The device of claim 13 wherein the mounting portion of the conductive sheet includes a slot means.

15. The device of claim 13 wherein the mounting portion of the conductive sheet includes a means for sheet bend urging.

* * * * *